United States Patent
Dinc et al.

(10) Patent No.: US 11,031,665 B2
(45) Date of Patent: Jun. 8, 2021

(54) MAGNETIC-FREE NON-RECIPROCAL CIRCUITS BASED ON SUB-HARMONIC SPATIO-TEMPORAL CONDUCTANCE MODULATION

(71) Applicants: Tolga Dinc, New York, NY (US); Harish Krishnaswamy, New York, NY (US)

(72) Inventors: Tolga Dinc, New York, NY (US); Harish Krishnaswamy, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 16/318,074

(22) PCT Filed: Jul. 21, 2017

(86) PCT No.: PCT/US2017/043402
§ 371 (c)(1),
(2) Date: Jan. 15, 2019

(87) PCT Pub. No.: WO2018/075113
PCT Pub. Date: Apr. 26, 2018

(65) Prior Publication Data
US 2019/0305397 A1    Oct. 3, 2019

Related U.S. Application Data

(60) Provisional application No. 62/365,018, filed on Jul. 21, 2016.

(51) Int. Cl.
*H01P 1/38* (2006.01)
*H03D 7/16* (2006.01)
(Continued)

(52) U.S. Cl.
CPC ............... *H01P 1/38* (2013.01); *H03D 7/165* (2013.01); *H04L 5/14* (2013.01); *H01P 1/383* (2013.01); *H03D 2200/0003* (2013.01)

(58) Field of Classification Search
CPC .............. H01P 1/38; H03D 7/165; H04L 5/14
See application file for complete search history.

(56) References Cited

U.S. PATENT DOCUMENTS

| 3,304,519 A | 2/1967 | Weiss |
| 4,061,905 A | 12/1977 | Fettweis |
| (Continued) | | |

FOREIGN PATENT DOCUMENTS

| CN | 1360727 | 7/2002 |
| CN | 101534092 | 9/2009 |
| (Continued) | | |

OTHER PUBLICATIONS

Abdelhalem, S.H., et al., "Tunable CMOS Integrated Duplexer with Antenna Impedance Tracking and High Isolation in the Transmit and Receive Bands", In IEEE Transactions on Microwave Theory and Techniques, vol. 62, No. 9, Sep. 2014, pp. 2092-2104.
(Continued)

*Primary Examiner* — Dinh T Le
(74) *Attorney, Agent, or Firm* — Byrne Poh LLP (57) ABSTRACT

A circuit comprising a differential transmission line and eight switches provides non-reciprocal signal flow. In some embodiments, the circuit can be driven by four local oscillator signals. The circuit can be used to form a gyrator. The circuit can be used to form a circulator. The circuit can be used to form three-port circulator than can provide direction signal flow between a transmitter and an antenna and from the antenna to a receiver. The three-port circulator can be used to implement a full duplex transceiver that uses a single antenna for transmitting and receiving.

10 Claims, 6 Drawing Sheets

(51) Int. Cl.
*H04L 5/14* (2006.01)
*H01P 1/383* (2006.01)

(56) References Cited

U.S. PATENT DOCUMENTS

| | | | |
|---|---|---|---|
| 4,079,377 A | 3/1978 | Zur Heiden et al. | |
| 4,641,365 A | 2/1987 | Montini, Jr. | |
| 5,191,579 A | 3/1993 | Matsushita et al. | |
| 5,608,361 A | 3/1997 | Weiss et al. | |
| 6,141,571 A | 10/2000 | Dionne | |
| 7,113,760 B1* | 9/2006 | Petrov | H03D 1/2245 455/209 |
| 7,599,675 B2* | 10/2009 | Mu | H03D 7/1441 375/345 |
| 7,778,611 B2 | 8/2010 | Asai et al. | |
| 8,155,602 B2 | 4/2012 | Ziaei et al. | |
| 8,576,752 B2 | 11/2013 | Sarca | |
| 8,829,973 B2 | 9/2014 | Sander | |
| 8,868,006 B2 | 10/2014 | Cox et al. | |
| 9,054,406 B2 | 6/2015 | Ueda et al. | |
| 9,197,170 B2 | 11/2015 | Corman et al. | |
| 9,203,455 B2 | 12/2015 | Yang et al. | |
| 9,319,210 B2 | 4/2016 | Choi et al. | |
| 9,325,432 B2 | 4/2016 | Hong et al. | |
| 9,337,885 B2 | 5/2016 | Mehlman et al. | |
| 10,044,321 B2* | 8/2018 | Bhagavatula | H03D 7/1483 |
| 2005/0248478 A1 | 11/2005 | Ling | |
| 2006/0057988 A1* | 3/2006 | Kirdhart | H03D 9/0633 455/189.1 |
| 2009/0051464 A1 | 2/2009 | Atsumo | |
| 2009/0247074 A1 | 10/2009 | Cox et al. | |
| 2009/0262784 A1* | 10/2009 | Ikeda | H03D 7/1441 375/130 |
| 2010/0109791 A1 | 5/2010 | Lingel | |
| 2013/0241669 A1 | 9/2013 | Mikhemar et al. | |
| 2013/0343235 A1 | 12/2013 | Khan | |
| 2014/0341581 A1 | 11/2014 | Lent et al. | |
| 2015/0016309 A1 | 1/2015 | Fang et al. | |
| 2015/0030280 A1 | 1/2015 | Alu et al. | |
| 2015/0188646 A1 | 7/2015 | Bharadia et al. | |
| 2015/0207537 A1 | 7/2015 | Cox et al. | |
| 2016/0087823 A1 | 3/2016 | Wang | |
| 2016/0112226 A1 | 4/2016 | Martinez et al. | |
| 2016/0126894 A1 | 5/2016 | Lakdawala et al. | |

FOREIGN PATENT DOCUMENTS

| | | |
|---|---|---|
| CN | 101611556 | 12/2009 |
| CN | 101753165 | 6/2010 |
| CN | 104769850 | 7/2015 |
| CN | 104168014 | 7/2017 |
| CN | 107681981 | 2/2018 |
| WO | WO 2017/139012 | 8/2017 |

OTHER PUBLICATIONS

Adam, J.D., et al., "Ferrite Devices and Materials", In IEEE Transactions on Microwave Theory and Technology, vol. 50, No. 3, Mar. 2002, pp. 721-737.

Adam, J.D., et al., "Monolithic Integration of an X-Band Circulator with GaAs MMICs", In Proceedings of the IEEE International Microwave Symposium, Orlando, FL, US, May 16-20, 1995, pp. 97-98.

Andrews, C. and Molnar, A.C., "Implications of Passive Mixer Transparency for Impedance Matching and Noise Figure in Passive Mixer-First Receivers", In IEEE Transactions on Circuits and Systems, vol. 57, No. 12, Dec. 2010, pp. 3092-3103.

Andrews, J.G., et al., "What Will 5G Be?", in IEEE Journal on Selected Areas in Communications, vol. 32, No. 6, Jun. 2014, pp. 1065-1082.

Ayati, S.A., et al., "Adaptive Integrated CMOS Circulator", In Proceedings of the IEEE Radio Frequency Integrated Circuits Symposium, San Francisco, CA, US, May 22-24, 2016, pp. 146-149.

Bharadia, D., et al., "Full Duplex Radios", In ACM SIGCOMM Computer Communication Review, vol. 43, No. 4, Oct. 2013, pp. 375-386.

Bi, L., et al., "On-Chip Optical Isolation in Monolithically Integrated Non-Reciprocal Optical Resonators", In Nature Photonics, vol. 5, No. 12, Dec. 2011, pp. 758-762.

Busignies, H. and Dishal, M., "Some Relations Between Speed of Indication, Bandwidth, Signal-to-Random-Noise Ratio in Radio Navigation and Direction Finding", In Proceedings of the IRE, vol. 37, No. 5, May 1949, pp. 478-488.

Carchon, G. and Nauwelaers, B., "Power and Noise Limitations of Active Circulators", In IEEE Transaction on Microwave Theory and Techniques, vol. 48, No. 2, Feb. 2000, pp. 316-319.

Chang, J.F., et al., "Design and Analysis of 24-GHz Active Isolator and Quasi-Circulator," In IEEE Transactions on Microwave Theory and Techniques, vol. 63, No. 8, Aug. 2015, pp. 2638-2649.

Choi, J.I., et al., "Achieving Single Channel, Full Duplex Wireless Communication", In Proceedings of MobiCom, Chicago, IL, US, Sep. 2010, pp. 1-12.

Dinc, T. and Krishnaswamy, H., "A T/R Antenna Pair with Polarization-Based Reconfigurable Wideband Self-Interference Cancellation for Simultaneous Transmit and Receive", In Proceedings of the IEEE International Microwave Symposium, Phoenix, AZ, US, May 2015, pp. 1-4.

Dinc, T. and Krishnaswamy, H., "A 28GHz Magnetic-Free Non-Reciprocal Passive CMOS Circulator Based on Spatio-Temporal Conductance Modulation", In IEEE International Solid-State Circuits Conference, Feb. 2017, pp. 294-295.

Dinc, T., et al., "A 60 GHz CMOS Full-Duplex Transceiver and Link with Polarization-Based Antenna and RF Cancellation", In IEEE Journal of Solid-State Circuits, vol. 51, No. 5, May 2016, pp. 1125-1140.

Dinc, T., et al., "A 60GHz Same-Channel Full-Duplex CMOS Transceiver and Link Based on Reconfigurable Polarization-Based Antenna Cancellation", In Proceedings of the IEEE Radio Frequency Integrated Circuits Symposium, Phoenix, AZ, US, May 2015, pp. 1-4.

Doerr, C.R., et al., "Silicon Photonics Broadband Modulation-Based Isolator", In Optics Express, vol. 22, No. 4, Feb. 20, 2014, pp. 4493-4498.

Duarte, M. and Sabharwal, A., "Full-Duplex Wireless Communications Using Off-the-Shelf Radios: Feasibility and First Results", In Conference Record of ASILOMAR, Nov. 2010, pp. 1558-1562.

Elkholy, M., et al., "Low-Loss Integrated Passive CMOS Electrical Balance Duplexers With Single-Ended LNA", In IEEE Transactions on Microwave Theory and Techniques, vol. 64, No. 5, May 2016, pp. 1544-1559.

Emami, S., et al. "A 60GHz CMOS Phased-Array Transceiver Pair for Multi-Gb/s Wireless Communications", In IEEE International Solid-State Circuits Conference Digest of Technical Papers, Feb. 2011, pp. 164-166.

Estep, N.A., et al., "Magnetic-Free Non-Reciprocity and Isolation Based on Parametrically Modulated Coupled-Resonator Loops", In Nature Physics, vol. 10, Dec. 2014, pp. 923-927.

Estep, N.A., et al., "Magnetless Microwave Circulators Based on Spatiotemporally Modulated Rings of Coupled Resonators", In IEEE Transactions on Microwave Theory and Techniques, vol. 64, No. 2, Feb. 2016, pp. 502-518.

Estep, N.A., et al., "On-Chip Non-Reciprocal Components Based on Angular-Momentum Biasing", In Proceedings of the IEEE International Microwave Symposium, Phoenix, AZ, US, May 2015, pp. 1-4.

Extended European Search Report dated Mar. 12, 2020 in European Patent Application No. 17861767.6, pp. 1-8.

Fan, L., et al., "An All-Silicon Passive Optical Diode", In Science, vol. 335, No. 447, Jan. 2012, pp. 447-450.

Fleury, R., et al., "Sound Isolation and Giant Linear Non-Reciprocity in a Compact Acoustic Circulator", In Science, vol. 343, No. 6170, Jan. 30, 2014, pp. 516-519.

(56) References Cited

OTHER PUBLICATIONS

Forbes, T., et al., "Design and Analysis of Harmonic Rejection Mixers with Programmable LO Frequency", In IEEE Journal of Solid-State Circuits, vol. 48, No. 10, Oct. 2013, pp. 2363-2374.
Galland, C., et al., "On-Chip Optical Non-Reciprocity Using Phase Modulators", In Optics Express, vol. 21, No. 12, Jun. 2013, pp. 14500-14511.
Gallo, K., et al., "All-Optical Diode in a Periodically Poled Lithium Niobate Waveguide", In Applied Physics Letters, vol. 79, No. 3, Jul. 16, 2001, pp. 314-316.
Ghaffari, A., et al., "Tunable High-Q N-Path Band-Pass Filters: Modeling and Verification", In IEEE Journal of Solid-State Circuits, vol. 46, No. 5, Apr. 2011, pp. 998-1010.
Gharpurey, R., "Linearity Enhancement Techniques in Radio Receiver Front-Ends", In IEEE Transactions on Circuits and Systems, vol. 59, No. 8, Aug. 2012, pp. 1667-1679.
Giannini, V., et al., "A 79 GHz Phase-Modulated 4 GHz-BW CW Radar Transmitter in 28 nm CMOS," In IEEE Journal of Solid-State Circuits, vol. 49, No. 12, Dec. 2014, pp. 2925-2937.
Goel, A., et al., "Tunable Duplexer with Passive Feed-Forward Cancellation to Improve the RX-TX Isolation", In IEEE Transactions on Circuits and Systems, vol. 62, No. 2, Feb. 2015, pp. 536-544.
Hasch, J., et al.,"Millimeter-Wave Technology for Automotive Radar Sensors in the 77 GHz Frequency Band," In IEEE Transactions on Microwave Theory and Techniques, vol. 60, No. 3, Mar. 2012, pp. 845-860.
Hong, S., et al., "Applications of Self-Interference Cancellation in 5G and Beyond", In IEEE Communications Magazine, vol. 52, No. 2, Feb. 2014, pp. 114-121.
International Search Report and Written Opinion dated Apr. 5, 2018 in International Patent Application No. PCT/US2017/043402, pp. 1-7.
International Search Report and Written Opinion dated Aug. 14, 2017 in International Patent Application No. PCT/US2016/065456, pp. 1-12.
Jalas, D., et al., "What Is—and What Is Not—an Optical Isolator", In Nature Photonics, vol. 7, Aug. 2013, pp. 579-582.
Kalialakis, C., et al., "Analysis and Design of Integrated Active Circulator Antennas", In IEEE Transactions on Microwave Theory and Techniques, vol. 48, No. 6, Jun. 2000, pp. 1017-1023.
Kamal, A., et al., "Noiseless Non-Reciprocity in a Parametric Active Device", In Nature Physics, vol. 7, Jan. 30, 2011, pp. 311-315.
Kang, M.S., et al., "Reconfigurable Light-Driven Opto-Acoustic Isolators in Photonic Crystal Fibre", In Nature Photonics, vol. 5, Sep. 2011, pp. 549-553.
Khanikaev, A.B., et al., "Topologically Robust Sound Propagation in an Angular-Momentum-Biased Graphene-Like Resonator Lattice", In Nature Communications, vol. 6, Oct. 6, 2015, pp. 1-7.
Kim, W.K., et al., "A Passive Circulator with High Isolation Using a Directional Coupler for RFID", In Proceedings of the IEEE International Microwave Symposium, San Francisco, CA, US, Jun. 11-16, 2006, pp. 1177-1180.
Knox, M.E., "Single Antenna Full Duplex Communications using a Common Carrier", In Proceedings of IEEE WAMICON, Apr. 2012, pp. 1-6.
Kodera, T., et al., "Artificial Faraday Rotaion Using a Ring Metamaterial Structure Without Static Magnetic Field", In Applied Physics Letters, vol. 99, Jun. 2011, pp. 1-4.
Kodera, T., et al., "Magnetless NonReciprocal Metamaterial Technology: Application to Microwave Components", In IEEE Transactions on Microwave Theory and Techniques, vol. 61, No. 3, Mar. 2013, pp. 1030-1042.
Laughlin, L., et al., "Passive and Active Electrical Balance Duplexers", In IEEE Transactions on Circuits and Systems, vol. 63, No. 1, Sep. 25, 2015, pp. 94-98.
LePage, W.R., et al., "Analysis of a Comb Filter Using Synchronously Commutated Capacitors", In Transactions of the American Institute of Electrical Engineers, vol. 72, No. 1, Mar. 1953, pp. 63-68.
Li, Y.A., et al., "A Fully Integrated 77GHz FMCW Radar System in 65nm CMOS", In IEEE International Solid-State Circuits Conference Digest of Technical Papers, Feb. 2010, pp. 216-218.
Lira, H., et al., "Electrically Driven Nonreciprocity Induced by Interband Photonic Transition on a Silicon Chip", In Physical Review Letters, vol. 109, Jul. 20, 2012, pp. 1-5.
Lira, H.L.R., et al., "Broadband Hitless Silicon Electro-Optic Switch for On-Chip Optical Networks", In Optics Express, vol. 17, No. 25, Dec. 7, 2009, pp. 22271-22280.
Mahmoud, A.M., et al., "All-Passive Nonreciprocal Metastructure", In Nature Communications, vol. 6, Sep. 28, 2015, pp. 1-7.
Marasevic, J., et al., "Resource Allocation and Rate Gains in Practical Full-Duplex Systems", In IEEE/ACM Transactions on Networking, vol. 25, No. 1, Feb. 2017, pp. 292-305.
Mikhemar, M., et al., "A Multiband RF Antenna Duplexer on CMOS: Design and Performance", In IEEE Journal of Solid-State Circuits, vol. 48, No. 9, Sep. 2013, pp. 2067-2077.
Mikhemar, M., et al., "A Tunable Integrated Duplexer with 50dB Isolation in 40nm CMOS," In IEEE International Solid-State Circuits Conference Digest of Technical Papers, Feb. 2009, pp. 386-387.
Mirzaei, A., et al., "Reconfigurable RF Front-Ends for Cellular Receivers", In Proceedings of the Compound Semiconductor Integrated Circuit Symposium, Monteray, CA, US, Oct. 3-6, 2010, pp. 1-4.
Mohr, R., "A New Nonreciprocal Transmission Line Device", In Proceedings of the IEEE, vol. 52, No. 5, May 31, 1964, pp. 612.
Natarajan, A., et al., "A Fully-Integrated 16-Element Phased-Array Receiver in SiGe BiCMOS for 60-GHz Communications", In IEEE Journal of Solid-State Circuits, vol. 46, No. 5, May 2011, pp. 1059-1075.
Notice of Allowance dated Aug. 11, 2017 in U.S. Appl. No. 15/391,292, pp. 1-36.
Notice of Allowance dated Oct. 21, 2019 in U.S. Appl. No. 15/774,410, pp. 1-32.
Nova Microwave, "Understanding Circulators and Isolators", available at: http://www.novamicro.com/understanding-circulator-and-isolaters.php, last accessed May 4, 2019, pp. 1-6.
Office Action dated Apr. 3, 2017 in U.S. Appl. No. 15/391,292, pp. 1-15.
Office Action dated May 16, 2019 in U.S. Appl. No. 15/774,410, pp. 1-50.
Office Action dated May 22, 2020 in CN Patent Application No. 201780057619.8, pp. 1-18.
Oliver, S.A., et al., "A Monolithic Single-Crystal Yttrium Iron Garnet/Silicon X-Band Circulator", In IEEE Microwave and Guided Wave Letters, vol. 7, No. 8, Aug. 1997, pp. 239-241.
Peng, B., et al., "Parity-Time-Symmetric Whispering-Gallery Microactivites", In Nature Physics, vol. 10, May 2014, pp. 394-398.
Pozar, D.M., "Microwave Engineering", 4th Edition, John Willey & Sons, 2012, pp. 72-75.
Qin, S., et al., "Nonreciprocal Components with Distributedly Modulated Capacitors", In IEEE Transactions on Microwave Theory and Techniques, vol. 62, No. 10, Oct. 2014, pp. 2260-2272.
Reiskarimian, N. and Krishnaswamy, H., "Design of All-Passive High-Order CMOS N-path Filters", In Proceedings of IEEE Radio Frequency Integrated Circuits Symposium (RFIC), Phoenix, AZ, US, May 17-19, 2015, pp. 83-86.
Reiskarimian, N. and Krishnaswamy, H., "Magnetic-Free Non-Reciprocity Based on Staggered Commutation", In Nature Communications, vol. 7, Apr. 15, 2016, pp. 1-10.
Reiskarimian, N., et al., "Analysis and Design of Two-Port N-Path Bandpass Filters With Embedded Phase Shifting", In IEEE Transactions on Circuits and Systems, vol. 63, No. 8, Aug. 2016, pp. 1-5.
Reiskarimian, N., et al., "A CMOS Passive LPTV Nonmagnetic Circulator and Its Application in a Full-Duplex Receiver", In IEEE Journal of Solid-State Circuits, vol. 52, No. 5, May 2017, pp. 1358-1372.
Sabharwal, A., et al., "In-Band Full-Duplex Wireless: Challenges and Opportunities", In IEEE Journal on Selected Areas in Communications, vol. 32, No. 9, Sep. 2014, pp. 1637-1652.
Sharma, A., "90-degree phase lump-element shifter", Microwaves101. com, Mar. 2016, pp. 1-5.

(56) References Cited

OTHER PUBLICATIONS

Shoji, Y., et al., "Magneto-Optical Isolator with Silicon Waveguides Fabricated by Direct Bonding", In Applied Physics Letter, vol. 92, Jan. 2008, pp. 1-4.

Skyworks Solutions Inc., "SKYFR-000709: 2110-2170 MHz Single Junction Robust Lead Circulator", Technical Paper, May 7, 2013, pp. 1-4.

Soer, M.C.M., et al., "Unified Frequency-Domain Analysis of Switched-Series-Passive Mixers and Samplers", In IEEE Transactions on Circuits and Systems, vol. 57, No. 10, Oct. 2010, pp. 2618-2631.

Soljacic, M., et al, "Nonlinear Photonic Crystal Microdevices for Optical Integration", In Optics Letters, vol. 28, No. 8, Apr. 15, 2003, pp. 637-639.

Sounas, D.L., et al., "Giant Reciprocity at the Subwavelength Scale Using Angular Momentum-Biased Metamaterials", In Nature Communications, vol. 4, Sep. 2, 2013, pp. 1-7.

Tanaka, S., et al., "The Realization of Circulators Using Transistors", In Proceedings of the IEEE, vol. 53, No. 3, Mar. 1965, pp. 260-267.

Tellegen, B., "The Gyrator a New Electric Network Element," In Philips Res. Rep., Apr. 1948, pp. 81-101.

Thomas, C.M., et al., "Brodband Synthetic Transmission-Line N-Path Filter Design", In IEEE Transactions on Microwave Theory and Techniques, vol. 63, No. 10, Oct. 2015, pp. 3525-3536.

Tyagi, S., et al., "An Advanced Low Power High Performance, Strained Channel 65nm Technology", In Proceedings of the IEEE International Electron Devices Meetings, Washington, DC, US, Dec. 2005, pp. 1-4.

Van Den Broek, D.J., et al., "An In-Band Full-Duplex Radio Receiver with Passive Vector Modulator Downmixer for Self-Interference Cancellation", In IEEE Journal of Solid State Circuits, vol. 50, No. 12, Dec. 2015, pp. 3003-3014.

Van den Broek, J.D.A., et al., "A Self-Interference Cancelling Receiver for In-Band Full-Duplex Wireless with Low Distortion under Cancellation of Strong TX Leakage", In Proceedings of the IEEE Solid-State Circuits Conference, San Francisco, CA, US, Feb. 2015, pp. 1-8.

Van Liempd, B., et al., "An Electrical-Balance Duplexer for In-Band Full-Duplex with <- 85dBm In-Band Distortion at +10dBm TX-Power", In Proceedings of the European Solid-State Circuits Conference, Graz, AT, Sep. 14-18, 2015, pp. 1-5.

Van Liempd, B., et al., "A +70dBm IIP3 Single-Ended Electrical-Balance Duplexer in 0.18um SOI CMOS," In IEEE ISSCC, Feb. 2015, pp. 1-3.

Vlasov, Y., et al., "High-Throughput Silicon Nanophotonic Wavelength-Insensitive Switch for On-Chip Optical Networks", In Nature Photonics, vol. 2, Apr. 2008, pp. 242-246.

Wang, S., et al., "Fully Integrated 10-GHz Active Circulator and Quasi-Circulator Using Bridged-T Networks in Standard CMOS", In IEEE Transactions on Very Larg Scale Integration (VLSI) Systems, vol. 24, No. 10, Oct. 2016, pp. 3184-3192.

Wang, Z., et al., "Gyrotropic Response in the Abscence of a Bias Field", In Proceedings of the National Academy of Sciences, vol. 109, No. 33, Aug. 14, 2012, pp. 13194-13197.

Wu, H.S., et al., "CMOS Active Quasi-Circulator with Dual Transmission Gains Incorporating Feedforward Technique at K-Band," In IEEE Transactions on Microwave Theory and Techniques, vol. 58, No. 8, Aug. 2010, pp. 2084-2091.

Yang, D., et al., "A Wideband Highly Integrated and Widely Tunable Transceiver for In-Band Full-Duplex Communication", In IEEE Journal of Solid State Circuits, vol. 50, No. 5, May 2015, pp. 1189-1202.

Yin, B., et al., "Full-Duplex in Large-Scale Wireless Systems", In Proceedings of the Asilomar Conference on Signals, Systems, and Computers, Nov. 2013, pp. 1623-1627.

Yu, Z. and Fan, S., "Complete Optical Isolation Created by Indirect Interband Photonic Transitions", In Nature Photonics, vol. 3, Jan. 11, 2009, pp. 91-94.

Yuksel, H., et al., "A Circuit-Level Model for Accurately Modeling 3rd Order Nonlinearity in CMOS Passive Mixers", In Proceedings of the IEEE Radio Frequency Integrated Circuits Symposium, Tampa, FL, US, Jun. 1-3, 2014, pp. 127-130.

Zander, J. and Mahonen, P., "Riding the Data Tsunami in the Cloud: Myths and Challenges in Future Wireless Access," In IEEE Communications Magazine, vol. 51, No. 3, Mar. 2013, pp. 145-151.

Zanjani, M.B., et al., "One-Way Phonon Isolation in Acoustic Waveguides", In Applied Physics Letters, vol. 104, Feb. 2014, pp. 1-5.

Zhang, T., et al., "An Integrated CMOS Passive Self-Interference Mitigation Technique for FDD Radios", In IEEE Journal of Solid-State Circuits, vol. 50, No. 5, May 2015, pp. 1176-1188.

Zhou, J., et al., "Integrated Wideband Self-Interference Cancellation in the RF Domain for FDD and Full-Duplex Wireless", In IEEE Journal of Solid-State Circuits, vol. 50, No. 12, Dec. 2015, pp. 3015-3031.

Zhou, J., et al., "Low-Noise Active Cancellation of Transmitter Leakage and Transmitter Noise in Broadband Wireless Receivers for FDD/Co-Existence", In IEEE Journal of Solid-State Circuits, vol. 49, No. 12, Dec. 2014, pp. 3046-3062.

Zhou, J., et al., "Receiver with Integrated Magnetic-Free N-Path-Filter-Based Non-Reciprocal Circulator and Baseband Self-Interference Cancellation for Full-Duplex Wireless", In Proceedings of the IEEE International Solid-State Circuits Conference, San Francisco, CA, US, Jan. 31-Feb. 4, 2016, pp. 178-180.

Zhou, J., et al., "Reconfigurable Receiver with >20MHz Bandwidth Self-Interference Cancellation Suitable for FDD, Co-Existence and Full-Duplex Applications", In Proceedings of the IEEE Solid-State Circuits Conference, San Francisco, CA, US, Feb. 25, 2015, pp. 1-3.

Zhu, Y., et al., "Demystifying 60GHz Outdoor Picocells", In Proceedings of the 20th Annual International Conference on Mobile Computing and Networking, New York, NY, US, Sep. 7-11, 2014, pp. 5-16.

\* cited by examiner

MAGNETIC-FREE NON-RECIPROCAL CIRCUITS BASED ON SUB-HARMONIC SPATIO-TEMPORAL CONDUCTANCE MODULATION

STATEMENT REGARDING FEDERALLY SPONSORED RESEARCH OR DEVELOPMENT

This invention was made with government support under contract FA8650-14-1-7414 awarded by the Air Force Materiel Command. The government has certain rights in the invention.

BACKGROUND

Full-duplex communications, in which a transmitter and a receiver of a transceiver operate simultaneously on the same frequency band, is drawing significant interest for emerging 5G communication networks due to its potential to double network capacity compared to half-duplex communications. Additionally, there are several efforts underway to include simultaneous transmit and receive functionality in the next generation phased array radar systems, especially in commercial automotive radars which can be an enabler technology for future connected or driverless cars. However, one of the biggest challenges from an implementation perspective is the antenna interface.

One way in which an antenna interface for a full-duplex transceiver can be implemented is using a non-reciprocal circulator. Reciprocity in electronics is a fundamental property of linear systems and materials described by symmetric and time-independent permittivity and permeability tensors. Non-reciprocity causes signals to travel in only one direction. For example, non-reciprocity in a circulator causes signals to travel in only one direction through the circulator. This directional signal flow enables full-duplex wireless communications because signals from the transmitter are only directed toward the antenna (and not the receiver) and received signals at the antenna are only directed toward the receiver (and not the transmitter). Moreover, the receiver is isolated from signals from the transmitter, preventing desensitization and possible breakdown of the receiver due to the high-power transmitted signal.

Conventionally, non-reciprocal circulators have been implemented using ferrite materials, which are materials that lose their reciprocity under the application of an external magnetic field. However, ferrite materials cannot be integrated into CMOS IC technology. Furthermore, the need for an external magnet renders ferrite-based circulators bulky and expensive.

Accordingly, new mechanisms for implementing non-reciprocity in circuits is desirable.

DETAILED DESCRIPTION

FIGS. 1A, 1B, 1C, and 1D show an example of how a non-reciprocal phase shift can be implemented in some embodiments.

Figure 1A:
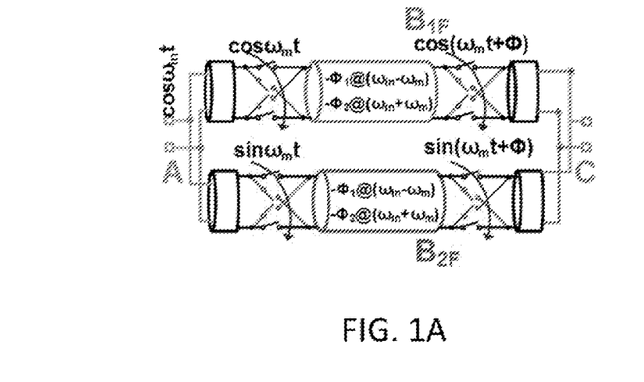
Figure 1B:
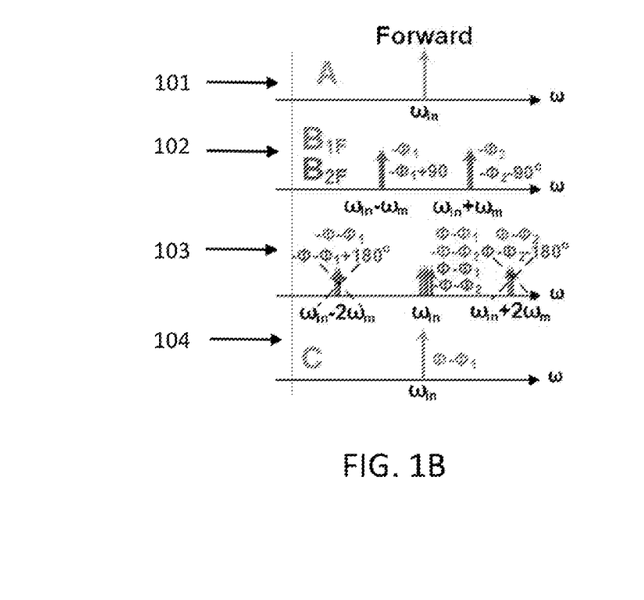

Turning to FIG. 1A, it can be seen that a signal $\cos(\omega_{in} t)$ can be injected at nodes A. This is represented in graph 101 of FIG. 1B. As shown in FIG. 1A, the switch groups can then be switched by the following signals: $\cos(\omega_m t)$; $\cos(\omega_m t+\phi)$; $\sin(\omega_m t)$; and $\sin(\omega_m t+\phi)$, where $\phi$ is 90°. $\phi_1$ and $\phi_2$ shown in FIGS. 1A and 1B relate to $\phi$ according to the following equation: $2\phi=180=\phi_1-\phi_2$ (or equivalently, $2*Td*\omega_m/\pi=1$ where Td is the delay of the transmission lines). As a result of the switching at the switch groups closest to nodes A, the input signal is commutated and two mixing products appear after the commutation on each transmission line at $\omega_{in}-\omega_m$ and $\omega_{in}+\omega_m$. These signals then flow through the top and bottom transmission lines (which provide $-\phi_1$ and $-\phi_2$ phase shifts at $\omega_{in}-\omega_m$ and $\omega_{in}+\omega_m$, respectively). The mixing tones flowing through the top transmission line appear at node B1F with total phase shifts of $-\phi_1$ and $-\phi_2$ at $\omega_{in}-\omega_m$ and $\omega_{in}+\omega_m$, respectively. The mixing tones flowing through the bottom line appear at node B2F with total phase shifts of $-\phi_1+90°$ and $-\phi_2-90°$ at $\omega_{in}-\omega_m$ and $\omega_{in}+\omega_m$, respectively. This is shown in graph 102 of FIG. 1B. The phase shifted signals are then commutated again at $\omega_m$, by the switch groups closest to nodes C, but with a phase shift of $\phi$. For each of the four signals in graph 102, two mixing products appear after the commutation at nodes C (for a total of eight signals). As shown in graph 103 of FIG. 1B, the mixing products appear at $\omega_{in}-2\omega_m$, $\omega_{in}$, and $\omega_{in}+2\omega_m$ with phase shifts as shown in the following table:

| Signal in Graph 102 | Mixing Product | Resulting Frequency | Resulting Phase Shift |
|---|---|---|---|
| $\omega_{in} - \omega_m, -\phi_1$ | 1 | $\omega_{in} - 2\omega_m$ | $-\phi - \phi_1$ |
| $\omega_{in} - \omega_m, -\phi_1$ | 2 | $\omega_{in}$ | $\phi - \phi_1$ |
| $\omega_{in} + \omega_m, -\phi_2$ | 1 | $\omega_{in}$ | $-\phi - \phi_2 = \phi - \phi_1$ |
| $\omega_{in} + \omega_m, -\phi_2$ | 2 | $\omega_{in} + 2\omega_m$ | $\phi - \phi_2$ |
| $\omega_{in} - \omega_m, -\phi_1 + 90°$ | 1 | $\omega_{in} - 2\omega_m$ | $-\phi - \phi_1 + 180°$ |
| $\omega_{in} - \omega_m, -\phi_1 + 90°$ | 2 | $\omega_{in}$ | $\phi - \phi_1$ |
| $\omega_{in} + \omega_m, -\phi_2 - 90°$ | 1 | $\omega_{in}$ | $-\phi - \phi_2 = \phi - \phi_1$ |
| $\omega_{in} + \omega_m, -\phi_2 - 90°$ | 2 | $\omega_{in} + 2\omega_m$ | $\phi - \phi_2 - 180°$ |

As can be seen, the signals at $\omega_{in}-2\omega_m$ and $\omega_{in}+2\omega_m$ are 180° out of phase and thus cancel out. Also, the signals at $\omega_{in}$ all have the same phase, and thus add up into a single signal with a phase shift of $\phi-\phi_1$, or $90°-\phi_1$. This is shown in graph 104 of FIG. 1B.

Figure 1C:
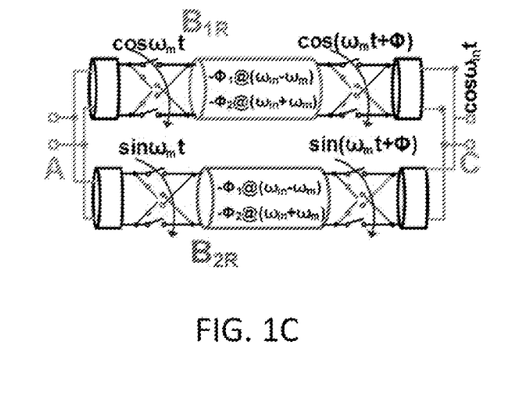
Figure 1D:
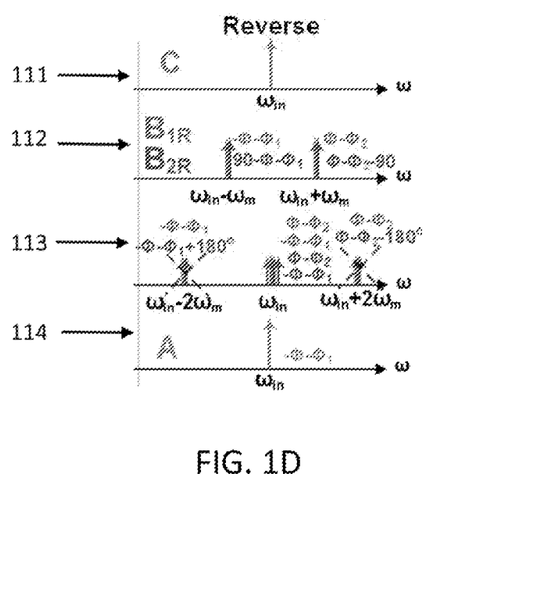

Turning to FIG. 1C, it can be seen that a signal $\cos(\omega_{in} t)$ can be injected at nodes C. This is represented in graph 111 of FIG. 1D. As shown in FIG. 1C, the switch groups are switched by the following signals: $\cos(\omega_m t)$; $\cos(\omega_m t+\phi)$; $\sin(\omega_m t)$; and $\sin(\omega_m t+\phi)$, where $\phi$ is 90°. $\phi_1$ and $\phi_2$ shown in FIGS. 1C and 1D relate to $\phi$ according to the following equation: $2\phi=180=\phi_1-\phi_2$ (or equivalently, $2*Td*\omega_m/\pi=1$ where Td is the delay of the transmission lines). As a result of the switching at the switch groups closest to nodes C, the input signal is commutated and two mixing products appear after the commutation on each transmission line at $\omega_{in}-\omega_m$ (with phase shifts of $-\phi$) and $\omega_{in}+\omega_m$ (with phase shifts of $\phi$). These signals then flow through the top and bottom transmission lines (which provide $-\phi_1$ and $-\phi_2$ phase shifts at $\omega_{in}-\omega_m$ and $\omega_{in}+\omega_m$, respectively). The mixing tones flowing through the top transmission line appear at node B1R with total phase shifts of $-\phi-\phi_1$ and $\phi-\phi_2$ at $\omega_{in}-\omega_m$ and $\omega_{in}+\omega_m$, respectively. The mixing tones flowing through the bottom line appear at node B2R with total phase shifts of $90°-\phi-\phi_1$ and $-90°+\phi-\phi_2$ at $\omega_{in}-\omega_m$ and $\omega_{in}+\omega_m$, respectively. This is shown in graph 112 of FIG. 1D. The phase shifted signals are then commutated again at corn, by the switch groups closest to nodes A. For each of the four signals in graph 112, two mixing products appear after the commutation at nodes A (for a total of eight signals). As shown in graph 113 of FIG. 1D, the mixing products appear at $\omega_{in}-2\omega_m$, $\omega_{in}$, and $\omega_{in}+2\omega_m$ with phase shifts as shown in the following table:

| Signal in Graph 112 | Mixing Product | Resulting Frequency | Resulting Phase Shift |
|---|---|---|---|
| $\omega_{in} - \omega_m, -\phi - \phi_1$ | 1 | $\omega_{in} - 2\omega_m$ | $-\phi - \phi_1$ |
| $\omega_{in} - \omega_m, -\phi - \phi_1$ | 2 | $\omega_{in}$ | $-\phi - \phi_1$ |
| $\omega_{in} + \omega_m, \phi - \phi_2$ | 1 | $\omega_{in}$ | $\phi - \phi_2 = -\phi - \phi_1$ |
| $\omega_{in} + \omega_m, \phi - \phi_2$ | 2 | $\omega_{in} + 2\omega_m$ | $\phi - \phi_2$ |
| $\omega_{in} - \omega_m, 90° - \phi - \phi_1$ | 1 | $\omega_{in} - 2\omega_m$ | $-\phi - \phi_1 + 180°$ |
| $\omega_{in} - \omega_m, 90° - \phi - \phi_1$ | 2 | $\omega_{in}$ | $-\phi - \phi_1$ |
| $\omega_{in} + \omega_m, \phi - \phi_2 - 90°$ | 1 | $\omega_{in}$ | $\phi - \phi_2 = -\phi - \phi_1$ |
| $\omega_{in} + \omega_m, \phi - \phi_2 - 90°$ | 2 | $\omega_{in} + 2\omega_m$ | $\phi - \phi_2 - 180°$ |

As can be seen, the signals at $\omega_{in}-2\omega_m$ and $\omega_{in}+2\omega_m$ are 180° out of phase and thus cancel out. Also, the signals at $\omega_{in}$ all have the same phase, and thus add up into a single signal with a phase shift of $-\phi-\phi_1$, or $-90°-\phi_1$. This is shown in graph 114 of FIG. 1D.

As can be seen in FIGS. 1C and 1D, the signals at win incur different phase shifts in the forward and reverse direction ($\phi-\phi_1$ and $-\phi-\phi_1$, respectively), demonstrating the phase non-reciprocity.

The scattering parameter matrix of the configuration shown in FIG. 1 can be represented by [S] as follows:

$$[S] = \begin{bmatrix} 0 & e^{j(-\phi-\phi_1)} \\ e^{j(\phi-\phi_1)} & 0 \end{bmatrix}$$

where: j is the square root of $-1$. The $-\phi$ in the term on the top right corner and $+\phi$ in the term on the bottom left corner show that the phase is non-reciprocal.

FIGS. 2A, 2B, 2C, and 2D show an example of how non-reciprocal amplitude (an isolator) can be implemented in some embodiments.

Figure 2A:
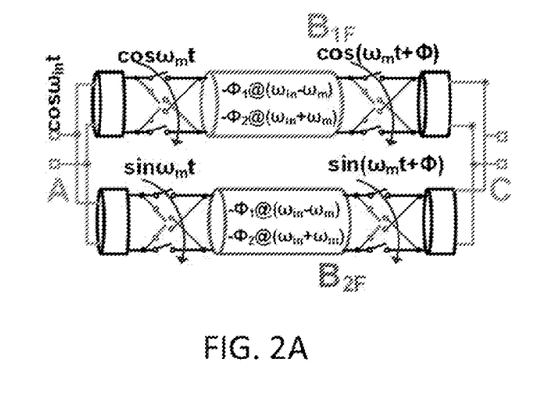
Figure 2B:
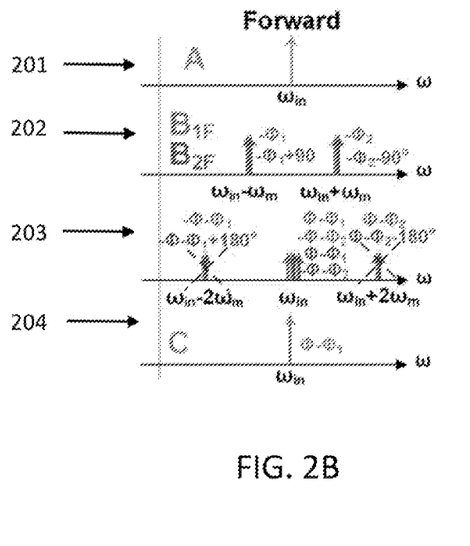

Turning to FIG. 2A, it can be seen that a signal $\cos(\omega_{in}t)$ is injected at nodes A. This is represented in graph 201 of FIG. 2B. As shown in FIG. 2A, the switch groups are switched by the following signals: $\cos(\omega_m t)$; $\cos(\omega_m t+\phi)$; $\sin(\omega_m t)$; and $\sin(\omega_m t+\phi)$, where $\phi$ is 45°. $\phi_1$ and $\phi_2$ shown in FIGS. 2A and 2B relate to $\phi$ according to the following equation: $2\phi=90°=\phi_1-\phi_2$ (or equivalently, $4*Td*\omega_m/\pi=1$ where $T_d$ is the delay of the transmission lines). As a result of the switching at the switch groups closest to nodes A, the input signal is commutated and two mixing products appear after the commutation on each transmission line at $\omega_{in}-\omega_m$ and $\omega_{in}+\omega_m$. These signals then flow through the top and bottom transmission lines (which provide $-\phi_1$ and $-\phi_2$ phase shifts at $\omega_{in}-\omega_m$ and $\omega_{in}+\omega_m$, respectively). The mixing tones flowing through the top transmission line appear at node B1F with total phase shifts of $-\phi_1$ and $-\phi_2$ at $\omega_{in}-\omega_m$ and $\omega_{in}+\omega_m$, respectively. The mixing tones flowing through the bottom line appear at node B2F with total phase shifts of $-\phi_1+90°$ and $-\phi_2-90°$ at $\omega_{in}-\omega_m$ and $\omega_{in}+\omega_m$, respectively. This is shown in graph 202 of FIG. 2B. The phase shifted signals are then commutated again at $\omega_m$, by the switch groups closest to nodes C, but with a phase shift of $\phi$. For each of the four signals in graph 202, two mixing products appear after the commutation at nodes C (for a total of eight signals). As shown in graph 203 of FIG. 2B, the mixing products appear at $\omega_{in}-\omega_m$, $\omega_{in}$, and $\omega_{in}+2\omega_m$ with phase shifts as shown in the following table:

| Signal in Graph 202 | Mixing Product | Resulting Frequency | Resulting Phase Shift |
|---|---|---|---|
| $\omega_{in} - \omega_m, -\phi_1$ | 1 | $\omega_{in} - 2\omega_m$ | $-\phi - \phi_1$ |
| $\omega_{in} - \omega_m, -\phi_1$ | 2 | $\omega_{in}$ | $\phi - \phi_1 = 45° - \phi_1$ |
| $\omega_{in} + \omega_m, -\phi_2$ | 1 | $\omega_{in}$ | $-\phi - \phi_2 = \phi - \phi_1 = 45° - \phi_1$ |
| $\omega_{in} + \omega_m, -\phi_2$ | 2 | $\omega_{in} + 2\omega_m$ | $\phi - \phi_2$ |
| $\omega_{in} - \omega_m, -\phi_1 + 90°$ | 1 | $\omega_{in} - 2\omega_m$ | $-\phi - \phi_1 - 180°$ |
| $\omega_{in} - \omega_m, -\phi_1 + 90°$ | 2 | $\omega_{in}$ | $\phi - \phi_1 = 45° - \phi_1$ |
| $\omega_{in} + \omega_m, -\phi_2 - 90°$ | 1 | $\omega_{in}$ | $-\phi - \phi_2 = \phi - \phi_1 = 45° - \phi_1$ |
| $\omega_{in} + \omega_m, -\phi_2 - 90°$ | 2 | $\omega_{in} + 2\omega_m$ | $\phi - \phi_2 - 180°$ |

As can be seen, the signals at $\omega_{in}-2\omega_m$ and $\omega_{in}-2\omega_m$ are 180° out of phase and thus cancel out. Also, the signals at coin all have the same phase, and thus add up into a single signal with a phase shift of $\phi-\phi_1$, or $45°-\phi_1$. This is shown in graph 204 of FIG. 2B.

Figure 2C:
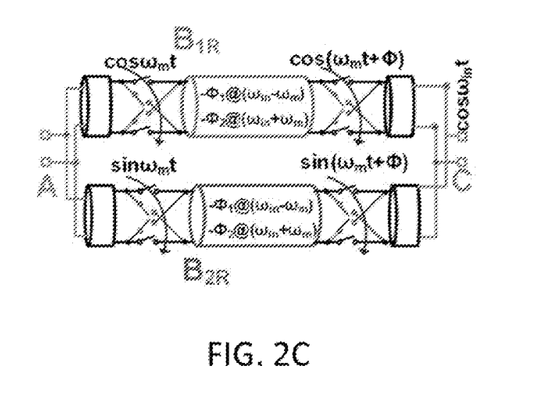
Figure 2D:
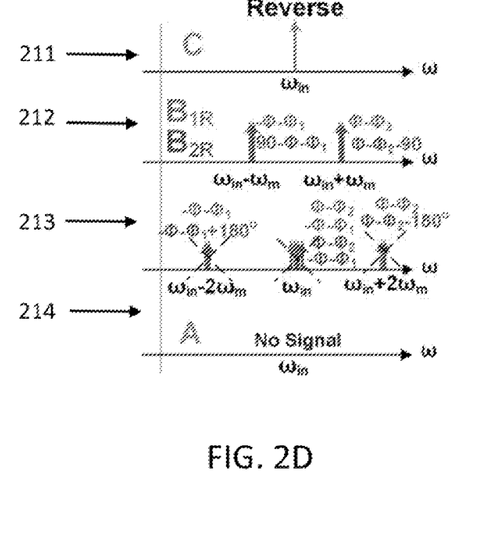

Turning to FIG. 2C, it can be seen that a signal $\cos(\omega_{in}t)$ is injected at nodes C. This is represented in graph 211 of FIG. 2D. As shown in FIG. 2C, the switch groups are switched by the following signals: $\cos(\omega_m t)$; $\cos(\omega_{in}t+\phi)$; $\sin(\omega_m t)$; and $\sin(\omega_m t+\phi)$, where $\phi$ is 45°. $\phi_1$ and $\phi_2$ shown in FIGS. 2C and 2D relate to $\phi$ according to the following equation: $2\phi=90=\phi_1-\phi_2$ (or equivalently, $4*T_d*\omega_m/\pi=1$ where Td is the delay of the transmission lines). As a result of the switching at the switch groups closest to nodes C, the input signal is commutated and two mixing products appear after the commutation on each transmission line at $\omega_{in}-\omega_m$ (with phase shifts of $-\phi$) and $\omega_{in}+\omega_m$ (with phase shifts of $\phi$). These signals then flow through the top and bottom transmission lines (which provides $-\phi_1$ and $\phi_2$ phase shifts at $\omega_{in}-\omega_m$ and $\omega_{in}+\omega_m$, respectively) The mixing tones flowing through the top transmission line appear at node B1R with total phase shifts of $-\phi-\phi_1$ and $\phi-\phi_2$ at $\omega_{in}-\omega_m$ and $\omega_{in}+\omega_m$, respectively. On the other hand, the mixing tones flowing through the bottom line appear at node B2R with total phase shifts of $90°-\phi-\phi_1$ and $-90°+\phi-\phi_2$ at $\omega_{in}-\omega_m$ and $\omega_{in}+\omega_m$, respectively. This is shown in graph 212 of FIG. 2D. The phase shifted signals are then commutated again at $\omega_m$, by the switch groups closest to nodes A. For each of the four signals in graph 212, two mixing products appear after the commutation at nodes A (for a total of eight signals). As shown in graph 213 of FIG. 2D, the mixing products appear at $\omega_{in}-2\omega_m$, $\omega_{in}$, and $\omega_{in}+2\omega_m$ with phase shifts as shown in the following table:

| Signal in Graph 212 | Mixing Product | Resulting Frequency | Resulting Phase Shift |
|---|---|---|---|
| $\omega_{in} - \omega_m, -\phi - \phi_1$ | 1 | $\omega_{in} - 2\omega_m$ | $-\phi - \phi_1$ |
| $\omega_{in} - \omega_m, -\phi - \phi_1$ | 2 | $\omega_{in}$ | $-\phi - \phi_1$ |
| $\omega_{in} + \omega_m, \phi - \phi_2$ | 1 | $\omega_{in}$ | $\phi - \phi_2 = -\phi - \phi_1$ |
| $\omega_{in} + \omega_m, \phi - \phi_2$ | 2 | $\omega_{in} + 2\omega_m$ | $\phi - \phi_2$ |
| $\omega_{in} - \omega_m, 90° - \phi - \phi_1$ | 1 | $\omega_{in} - 2\omega_m$ | $-\phi - \phi_1 - 180°$ |
| $\omega_{in} - \omega_m, 90° - \phi - \phi_1$ | 2 | $\omega_{in}$ | $-\phi - \phi_1$ |
| $\omega_{in} + \omega_m, \phi - \phi_2 - 90°$ | 1 | $\omega_{in}$ | $\phi - \phi_2 = -\phi - \phi_1$ |
| $\omega_{in} + \omega_m, \phi - \phi_2 - 90°$ | 2 | $\omega_{in} + 2\omega_m$ | $\phi - \phi_2 - 180°$ |

As can be seen, the signals at $\omega_{in}-2\omega_m$, $\omega_{in}$, and $\omega_{in}+2\omega_m$ are 180° out of phase and thus cancel out. This is shown in graph 214 of FIG. 2D.

As can be seen in FIGS. 2C and 2D, the signal at $\omega_{in}$ can only pass in the forward direction while it is completely attenuated in the reverse direction, showing amplitude non-reciprocity.

FIGS. 2A, 2B, 2C, and 2D describe an isolator configuration, where signals can travel in one direction but not the reverse direction. An isolator is like one arm of a circulator.

It is useful because it can be placed between a power amplifier and its antenna, and it will protect the power amplifier from back reflections at the antenna.

Another use of the structures of FIGS. 1A, 1B, 2A, and 2B is a 2D lattice of such structures which can have a programmable signal propagation based on the phase shifts of the different switches.

Figure 3:
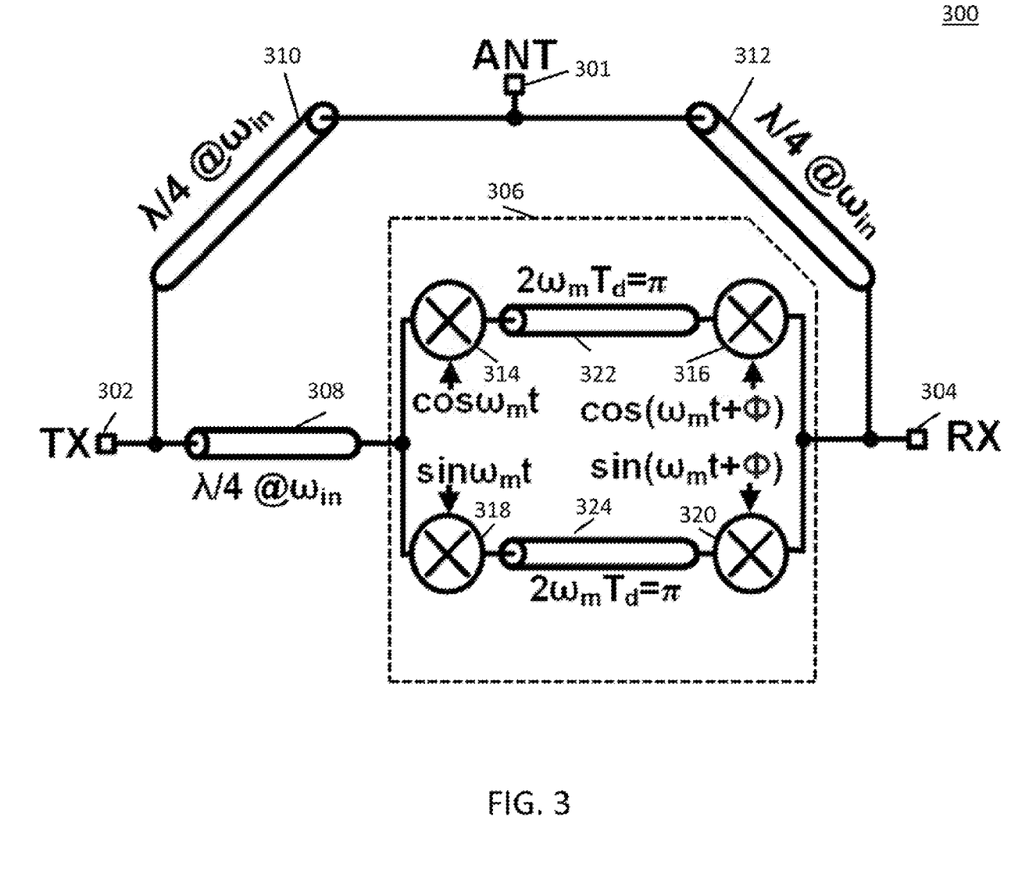

Turning to FIG. 3, an example 300 of a circulator architecture in accordance with some embodiments is shown. As illustrated, circulator 300 includes an antenna port 301, a transmitter port 302, a receiver port 304, a non-reciprocal phase component 306, and transmission lines 308, 310, and 312. Within non-reciprocal phase component 306, there are passive mixers 314, 316, 318, and 320, and transmission lines 322 and 324.

As shown in FIG. 3, values of signals and components in non-reciprocal phase component 306 may depend on an input frequency ($\omega_{in}$) and a modulation frequency ($\omega_m$). Win represents the frequency of operation of the circulator. $\omega_m$ represents the frequency at which the mixers are modulated. Any suitable frequencies can be used for $\omega_{in}$ and $\omega_m$, in some embodiments. For example, in some embodiments, RF/millimeter-wave/Terahertz frequencies can be used. In some embodiments, $\omega_{in}$ and $\omega_m$ may be required to be sized relative to each other. For example, in some embodiments, the mixing signals at $\omega_{in}+\omega_m$ and $\omega_{in}-\omega_m$ should be 180° out of phase or equivalently the following equation may be required to be met: $2\omega_m T_d = 180°$, where $T_d$ is the group delay. More particularly, for example, in some embodiments, $\omega_{in}$ can be 28 GHz and $\omega_m$ can be 9.33 GHz.

Each of the transmission lines in FIG. 3 is illustrated as having a "length" that is based on a given frequency. For example, transmission lines 308, 310, and 312 are illustrated as having a length equal to $\lambda/4$, where $\lambda$ is the wavelength for a frequency of $\omega_{in}$. As another example, transmission lines 322 and 324 are illustrated as providing 180° phase difference between the signals at $\omega_{in}+\omega_m$ and $\omega_{in}-\omega_m$ or equivalently a group delay of $T_d = \frac{1}{4}(\omega_m/2\pi)$.

Transmission lines 308, 310, 312, 322, and 324 can be implemented in any suitable manner. For example, in some embodiments, one or more of the transmission lines can be implemented as C-L-C pi-type lumped sections. In some other embodiments, they may be implemented as truly distributed transmission lines.

The passive mixers can be driven by signals as shown in FIG. 3, in some embodiments. For example, in some embodiments, mixer 314 can be driven by a signal $\cos(\omega_m t)$, mixer 316 can be driven by a signal $\cos(\omega_m t + \phi)$, mixer 318 can be driven by a signal $\sin(\omega_m t)$, and mixer 320 can be driven by a signal $\sin(\omega_m t + \phi)$, where $\phi$ is 90° for $T_d = \frac{1}{4}(\omega_m/2\pi)$.

Figure 4A:
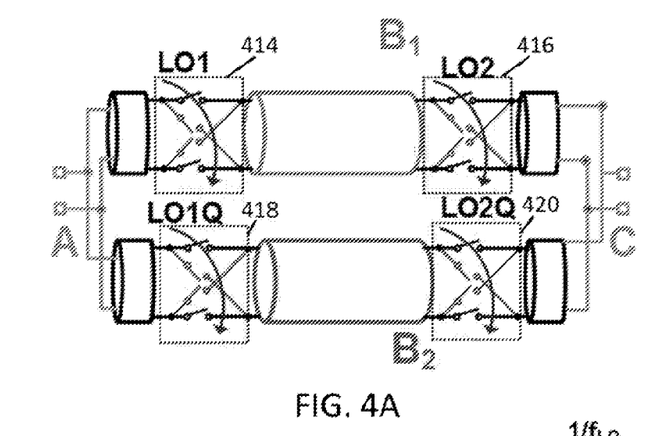
Figure 4B:
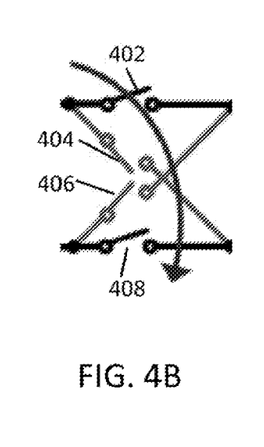

In some embodiments, mixers 314, 316, 318, and 320 shown in FIG. 3 can be implemented with switch groups 414, 416, 418, and 420, respectively, as illustrated in FIG. 4A. As shown in FIG. 4B, the switch groups in FIG. 4A can each include four switches 402, 404, 406, and 408, in some embodiments.

The switches in the switch groups can be implemented in any suitable manner. For example, in some embodiments, the switches can be implemented using NMOS transistors, PMOS transistors, both NMOS and PMOS transistors, or any other suitable transistor or any other switch technology.

Figure 4C:
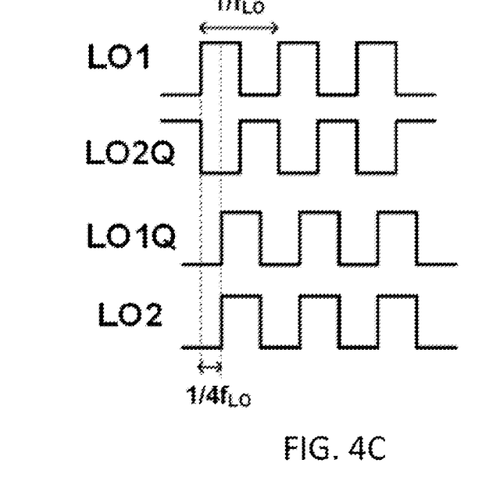

Switch groups 414, 416, 418, and 420 can be controlled by local oscillator signals LO1, LO2, LO1Q, and LO2Q, respectively, as shown in FIG. 4A, in some embodiments. A timing diagram showing an example of these signals with respect to each other is shown in FIG. 4C. In this diagram, $f_{LO}$ is equal to $\omega_m/2\pi$. When a local oscillator (e.g., LO1, LO2, LO1Q, or LO2Q) is HIGH, switches 402 and 408 in the corresponding switch group are CLOSED and switches 404 and 406 in the corresponding switch group are OPEN. When a local oscillator (e.g., LO1, LO2, LO1Q, or LO2Q) is LOW, switches 404 and 406 in the corresponding switch group are OPEN and switches 404 and 406 in the corresponding switch group are CLOSED.

Figure 5:
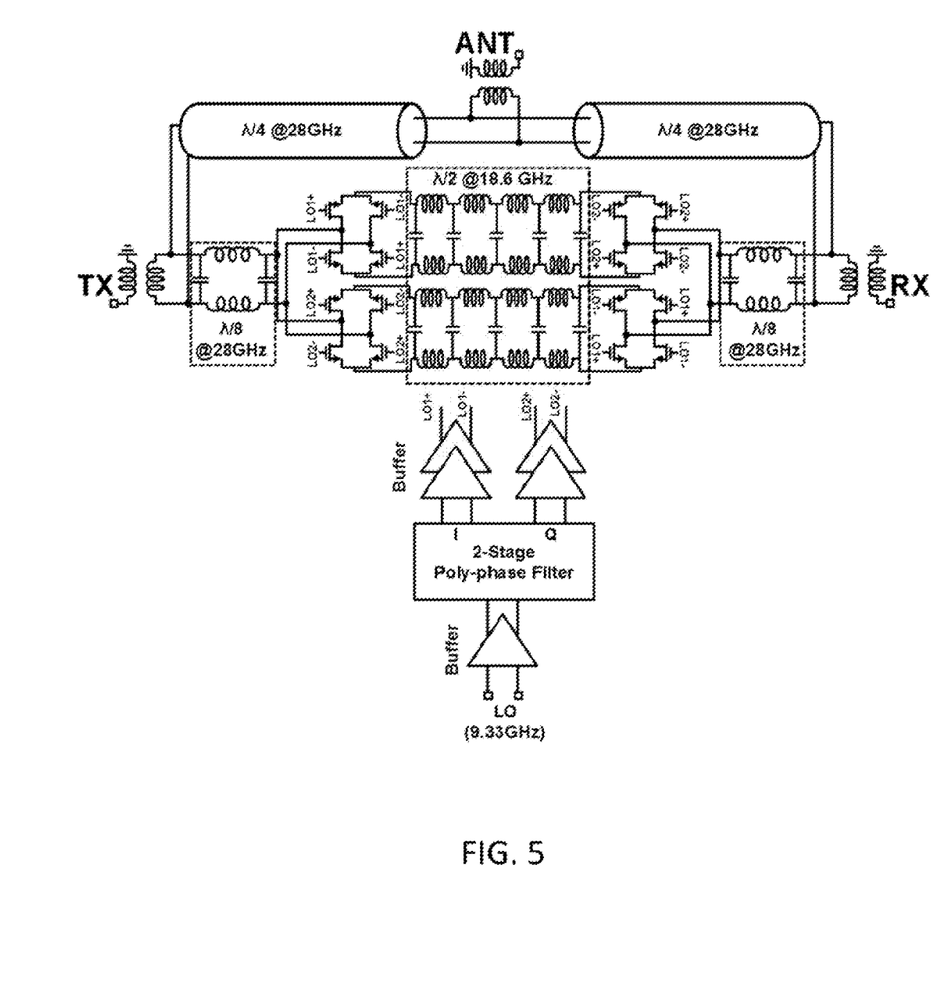

Turning to FIG. 5, an example of a schematic of a circulator that can be implemented in accordance with some embodiments is shown. This circulator is generally in the same architecture as shown in FIG. 3, except that transmission line 308 is split in half and part is place adjacent to the receiver nodes.

Figure 6:
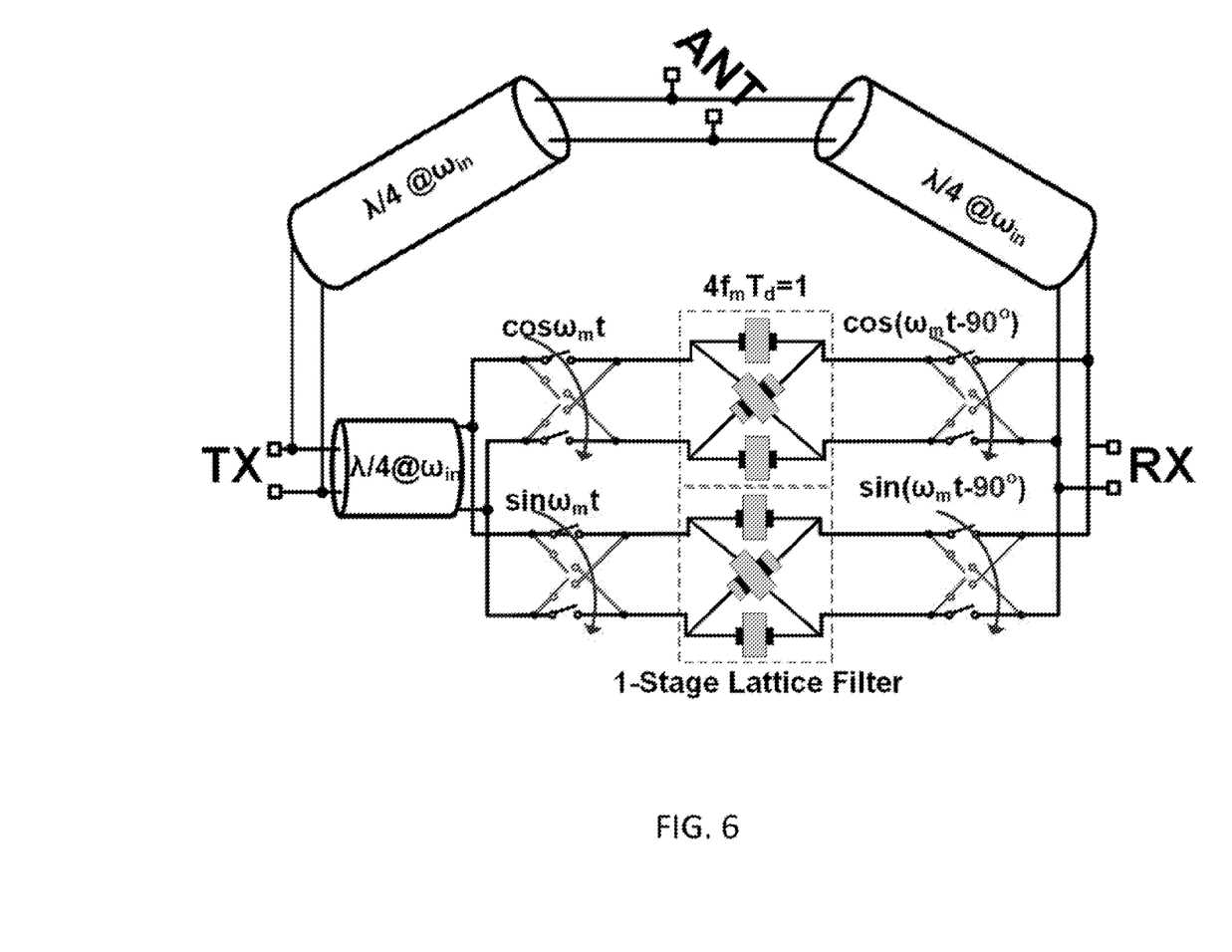

Turning to FIG. 6, an example of the architecture of FIG. 3 using 1-stage lattice filters instead of transmission lines 322 and 324 (FIG. 3) is shown. Any suitable filters can be used. For example, in some embodiments, film bulk acoustic resonator (FBAR) filters, surface acoustic wave (SAW) filters, bulk acoustic wave (BAW) filters, and/or any other suitable filters can be used. By implementing large delays using SAW or BAW filters, the clock frequency can be even further reduced. This can be exploited to design even-higher-linearity circulators through the use of high-voltage technologies and high-linearity switch design techniques.

The circuits described herein can be implemented in any suitable technology in some embodiments. For example, in some embodiments, these circuits can be implemented in any semiconductor technology such as silicon, Gallium Nitride (GaN), Indium phosphide (InP), Gallium arsenide (GaAs), etc. More particularly, for example, in some embodiments, the circuits can be implemented in IBM 45 nm SOI CMOS process.

In FIG. 1 the phase shift provided by the non-reciprocal phase component, $\phi - \phi_1$, can be tuned by changing the clock phase, $\phi$. The frequency at which TX-to-RX isolation is achieved depends on $\phi - \phi_1$, so by tuning $\phi$, we can tune the isolation frequency.

Although the disclosed subject matter has been described and illustrated in the foregoing illustrative implementations, it is understood that the present disclosure has been made only by way of example, and that numerous changes in the details of implementation of the disclosed subject matter can be made without departing from the spirit and scope of the disclosed subject matter. Features of the disclosed implementations can be combined and rearranged in various ways.

What is claimed is:

1. A circuit, comprising:
   a first differential transmission line having: a first end having a first connection and a second connection; and a second end having a third connection and a fourth connection;
   a first switch having a first side, a second side, and a control, wherein the first side of the first switch is connected to the first connection;
   a second switch having a first side, a second side, and a control, wherein the first side of the second switch is connected to the first connection;
   a third switch having a first side, a second side, and a control, wherein the first side of the third switch is connected to the second connection and the second side of the third switch is connected to the second side of the first switch and a first node;
   a fourth switch having a first side, a second side, and a control, wherein the first side of the fourth switch is connected to the second connection and the second side of the fourth switch is connected to the second side of the second switch and a second node;
a fifth switch having a first side, a second side, and a control, wherein the first side of the fifth switch is connected to the third connection;
a sixth switch having a first side, a second side, and a control, wherein the first side of the sixth switch is connected to the third connection;
a seventh switch having a first side, a second side, and a control, wherein the first side of the seventh switch is connected to the fourth connection and the second side of the seventh switch is connected to the second side of the fifth switch and a third node;
an eighth switch having a first side, a second side, and a control, wherein the first side of the eighth switch is connected to the fourth connection and the second side of the eighth switch is connected to the second side of the sixth switch and a fourth node;
a second differential transmission line having: a first end having a fifth connection and a sixth connection; and a second end having a seventh connection and an eighth connection;
a ninth switch having a first side, a second side, and a control, wherein the first side of the ninth switch is connected to the fifth connection;
a tenth switch having a first side, a second side, and a control, wherein the first side of the tenth switch is connected to the fifth connection;
an eleventh switch having a first side, a second side, and a control, wherein the first side of the eleventh switch is connected to the sixth connection and the second side of the eleventh switch is connected to the second side of the ninth switch and the first node;
a twelfth switch having a first side, a second side, and a control, wherein the first side of the twelfth switch is connected to the sixth connection and the second side of the twelfth switch is connected to the second side of the tenth switch and the second node;
a thirteenth switch having a first side, a second side, and a control, wherein the first side of the thirteenth switch is connected to the seventh connection;
a fourteenth switch having a first side, a second side, and a control, wherein the first side of the fourteenth switch is connected to the seventh connection;
a fifteenth switch having a first side, a second side, and a control, wherein the first side of the fifteenth switch is connected to the eighth connection and the second side of the fifteenth switch is connected to the second side of the thirteenth switch and the third node; and
a sixteenth switch having a first side, a second side, and a control, wherein the first side of the sixteenth switch is connected to the eighth connection and the second side of the sixteenth switch is connected to the second side of the fourteenth switch and the fourth node.

2. A circuit, comprising:
a first differential transmission line having: a first end having a first connection and a second connection; and a second end having a third connection and a fourth connection;
a first switch having a first side, a second side, and a control, wherein the first side of the first switch is connected to the first connection;
a second switch having a first side, a second side, and a control, wherein the first side of the second switch is connected to the first connection;
a third switch having a first side, a second side, and a control, wherein the first side of the third switch is connected to the second connection and the second side of the third switch is connected to the second side of the first switch and a first node;
a fourth switch having a first side, a second side, and a control, wherein the first side of the fourth switch is connected to the second connection and the second side of the fourth switch is connected to the second side of the second switch and a second node;
a fifth switch having a first side, a second side, and a control, wherein the first side of the fifth switch is connected to the third connection;
a sixth switch having a first side, a second side, and a control, wherein the first side of the sixth switch is connected to the third connection;
a seventh switch having a first side, a second side, and a control, wherein the first side of the seventh switch is connected to the fourth connection and the second side of the seventh switch is connected to the second side of the fifth switch and a third node;
an eighth switch having a first side, a second side, and a control, wherein the first side of the eighth switch is connected to the fourth connection and the second side of the eighth switch is connected to the second side of the sixth switch and a fourth node; and
at least one other differential transmission line having a total delay of three quarters of a period of an operating frequency of the circuit, having a first side having a ninth connection and a tenth connection, and having a second side having an eleventh connection and a twelfth connection, wherein the ninth connection is connected to the second side of the first switch, the tenth connection is connected to the second side of the fourth switch, the eleventh connection is connected to the second side of the fifth switch, and the twelfth connection is connected to the second side of the eighth switch.

3. The circuit of claim 2, wherein the at least one other differential transmission line comprises:
a third differential transmission line having a delay of one quarter of the period of the operating frequency of the circuit;
a fourth differential transmission line having a delay of one quarter of the period of the operating frequency of the circuit; and
at least one fifth differential transmission line having a total delay of one quarter of the period of the operating frequency of the circuit,
wherein the third differential transmission line, the fourth differential transmission line, and the at least one fifth differential transmission line form a series connection between: the first node and the second node; and the third node and the fourth node.

4. The circuit of claim 3, further comprising a transmitter port, an antenna port, and a receiver port, wherein the third differential transmission line is connected between the transmitter port and the antenna port, and the fourth differential transmission line is connected between the antenna port and the receiver port.

5. The circuit of claim 3, wherein the at least one fifth differential transmission line comprises:
a sixth differential transmission line having a delay of one eighth of the period of the operating frequency of the circuit; and
a seventh differential transmission line having a delay of one eighth of the period of the operating frequency of the circuit, wherein the sixth differential transmission line is connected between the third differential transmission line and the third node and the fourth node, and the seventh differential transmission line is connected between the fourth differential transmission line and the third node and the fourth node.

6. The circuit of claim 1, wherein the control of the first switch and the control of the fourth switch are connected to a first local oscillator signal, the control of the second switch and the control of the third switch are connected to a second local oscillator signal, the control of the fifth switch and the control of the eighth switch are connected to a third local oscillator signal, and the control of the sixth switch and the control of the seventh switch are connected to a fourth oscillator signal.

7. The circuit of claim 6, wherein the first oscillator signal and the first oscillator signal and the second oscillator signal are 180 degrees out of phase, the third oscillator signal and the fourth oscillator signal are 180 degrees out of phase, and the third oscillator signal is delay from the first oscillator signal by one quarter of a period of an operating frequency of the circuit.

8. The circuit of claim 7, wherein the first local oscillator, the second local oscillator, the third local oscillator, and the fourth local oscillator each have a 50% duty cycle.

9. The circuit of claim 1, wherein the first differential transmission line has a delay of one quarter of a period of an operating frequency of the circuit.

10. The circuit of claim 1, wherein the first differential transmission line is implemented as at least one C-L-C pi-type lumped section.

* * * * *